Figure 1:
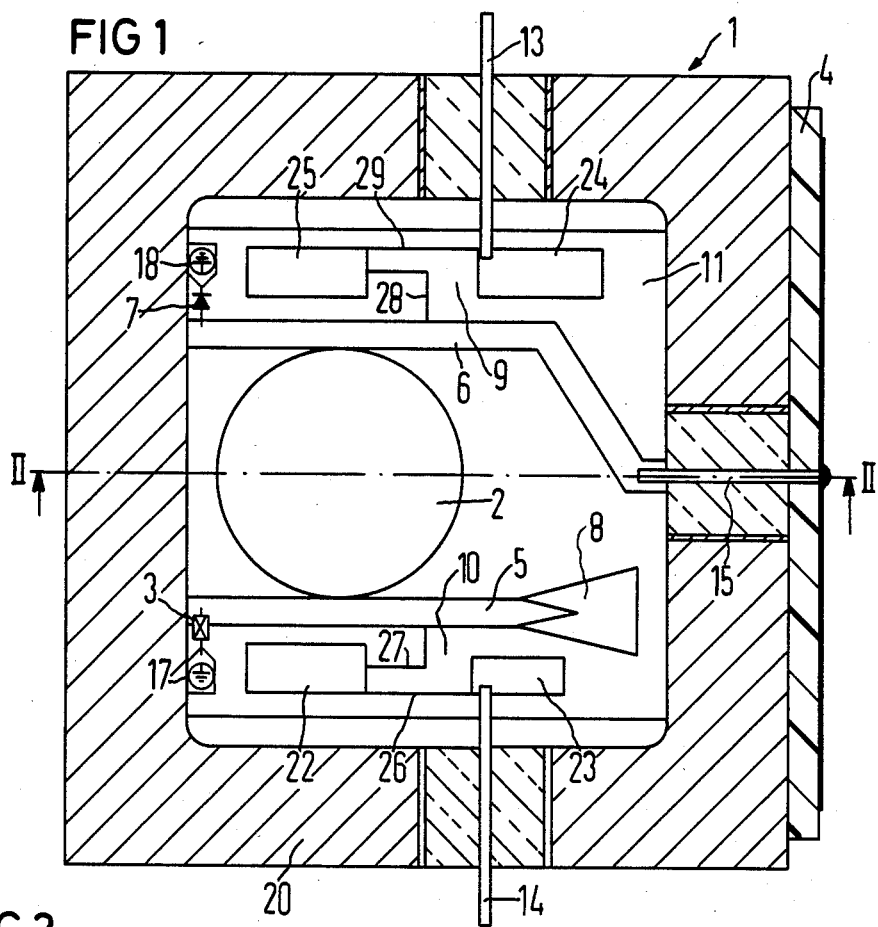

United States Patent [19]
Müller et al.

[11] Patent Number: 4,731,611
[45] Date of Patent: Mar. 15, 1988

[54] STRIPLINE DOPPLER RADAR

[75] Inventors: Jörg Müller, Buchholz; Andreas Reppekus, Munich, both of Fed. Rep. of Germany

[73] Assignee: Siemens Aktiengesellschaft, Berlin and Munich, Fed. Rep. of Germany

[21] Appl. No.: 622,674

[22] Filed: Jun. 20, 1984

[30] Foreign Application Priority Data

Jun. 21, 1983 [DE] Fed. Rep. of Germany ....... 3322304

[51] Int. Cl.$^4$ ............................................. G01S 13/50
[52] U.S. Cl. ............................... 342/28; 331/107 SL; 333/235
[58] Field of Search .................... 343/5 PD, 7 PF, 7.7, 343/8, 700 MS, ; 340/552, 554; 364/438; 333/202, 219, 235; 331/107 DP, 107 SL, 96; 342/27, 28, 104

[56] References Cited

U.S. PATENT DOCUMENTS

| | | | |
|---|---|---|---|
| 3,798,578 | 3/1974 | Konishi et al. | 333/202 X |
| 3,893,109 | 7/1975 | Chiron et al. | 343/5 PD |
| 4,360,810 | 11/1982 | Landt | 343/5 PD X |
| 4,443,796 | 4/1984 | Müller | 343/5 PD |
| 4,514,707 | 4/1985 | Dydyk et al. | 331/107 SL |
| 4,574,256 | 3/1986 | Singh | 331/107 SL |
| 4,591,806 | 5/1986 | Havens | 331/96 |
| 4,630,004 | 12/1986 | Niehenke et al. | 331/107 SL |
| 4,639,690 | 1/1987 | Lewis | 331/96 |
| 4,652,836 | 3/1987 | Accatino et al. | 331/96 |

FOREIGN PATENT DOCUMENTS

| | | | |
|---|---|---|---|
| 0156002 | 12/1981 | Japan | 331/96 |
| 1279583 | 6/1972 | United Kingdom | 343/7.7 |
| 3019887 | 5/1980 | United Kingdom | |
| 2040623 | 8/1980 | United Kingdom | 343/8 |

OTHER PUBLICATIONS

"MM Wavelength Passive Components", by J. Mahieu; Microwave Journal (11/76), pp. 41–42.
"Microwave Intruder Alarm", by M. Hosking; Wireless World (7/77), pp. 36–39.
"Active Integrated Devices on Dielectric Substrates for MM-Wave Applications"; by R. Mittra et al; IEEE International Microwave Symposium (Orlando, 4/30–5/2/79).

Primary Examiner—T. H. Tubbesing
Assistant Examiner—Bernarr Earl Gregory
Attorney, Agent, or Firm—Herbert L. Lerner; Laurence A. Greenberg

[57] ABSTRACT

A stripline Doppler Radar includes at least one high-frequency oscillator, a first stripline conductor connected to the oscillator, a second stripline conductor spaced from the first stripline conductor, at least one receiving diode connected to the second stripline conductor, an antenna connected to the second stripline conductor, low frequency external electrical terminals, filters connected between the stripline conductors and the external electrical terminals for inhibiting leakage of high-frequency power through the external electrical terminals, and a dielectric resonator adjustable in position from a location between the stripline conductors to a location partially covering one of the stripline conductors for conducting power delivered by the oscillator through the stripline conductors and the dielectric resonator to the receiving diode and the antenna, and for adjusting power radiated through the antenna, power received through the antenna and power transmitted from the oscillator through the resonator directly to the receiving diode.

26 Claims, 2 Drawing Figures

STRIPLINE DOPPLER RADAR

The invention relates to a stripline Doppler radar. German Published, Non-Prosecuted application DE-OS No. 30 19 887, corresponding to U.S. Pat. No. 4,443,796 discloses a Doppler radar for the frequency range from 9.3 to 10.7 GHz, which has a relatively large geometry. The wavelength relation governing the waveguide dimensions prohibits the geometry of such a Doppler radar from being reduced in a simple manner. Although a shift to higher frequencies, such as to 24 GHz instead of 10 GHz, reduces the required geometry on one hand, it increases the requirements as to the manufacturing tolerances, on the other hand. Smaller geometries cause the power losses to be simultaneously increased when tuning with tuning screws that are provided for this purpose. In addition, it is only possible to vary the frequency in Doppler radars by varying the waveguide construction, within relatively narrow limits. This narrows the application of such equipment in different countries with different permissible frequencies.

It is accordingly an object of the invention to provide stripline Doppler radar, which overcomes the hereinaforementioned disadvantages of the heretofore-known devices of this general type, which has small geometric dimensions, high reliability, ready variability of the frequency generated, simple adjustability of sensitivity, and mutual matching of transmitting components and receiving components within a certain bandwidth.

With the foregoing and other objects in view, there is provided, in accordance with the invention, a stripline Doppler Radar including at least one high-frequency oscillator, a first stripline or stripline conductor connected to the oscillator, a second stripline or stripline conductor spaced from the first stripline conductor, at least one receiving diode connected to the second stripline conductor, an antenna connected to the second stripline conductor, low frequency carrying external electrical terminals, filters connected between the stripline conductors and the external electrical terminals for inhibiting leakage of high-frequency power through the external electrical terminals, and a dielectric resonator attached and adjustable in position from a location between the stripline conductors to a location between and/or partially covering one or the other of the stripline conductors for conducting power delivered by the oscillator through the stripline conductors and the dielectric resonator to the receiving diode and the antenna, and for simultaneously adjusting power radiated through the antenna, power received through the antenna and power transmitted from the oscillator through the resonator directly to the receiving diode, the so-called pumping power.

In accordance with another feature of the invention the filters are band rejection or lowpass filters.

Small geometric dimensions and high reliability can be achieved through the use of a dielectric resonator instead of cavity resonators. This is due to the fact that fault sources typical for cavity resonators such as erratic contacts in tuning screws and similar devices, are eliminated. The frequency used can be changed by varying the dimensions of the dielectric resonator. The adjustability of the sensitivity of the device is made possible by adjusting the position of the dielectric resonator relative to the stripline branch on the transmitter side or relative to the stripline branch on the receiver side. This simultaneously matches the transmitter components and receiver components within a certain bandwidth.

The placement of the stripline Doppler radar according to the invention eliminates the use of coupling capacitors which are generally provided for separating the d-c voltage of the oscillator element and the receiver diodes. This results in lower high-frequency losses, fewer reflecting discontinuities in the path of the striplines and fewer contacts. Such a Doppler radar is therefore more reliable and less expensive.

In accordance with a further feature of the invention, there is provided a substrate, the stripline conductors, resonator, oscillator, receiving diode and filters being disposed in common on the substrate. This measure simplifies production substantially. Such production can also be automated.

In accordance with again an additional feature of the invention, the oscillator has a high-frequency output and the first stripline conductor has one end connected to the high-frequency output and another end, and including a terminating resistor connected to the other end of the first stripline conductor.

In accordance with again another feature of the invention, there is provided a substrate on which the stripline conductors are disposed, the terminating resistor being in the form of a resistance film disposed on the substrate.

The terminating resistor prevents a considerable part of the power generated by the high-frequency oscillator from being reflected at the end of the stripline conductor. In this way, the stripline resonator on the transmitter side acquires such a low Q-factor that the oscillation frequency is determined only by the dielectric resonator. The Doppler radar according to the invention is further provided with slight overcoupling of the oscillator power from the oscillator branch into the receiving branch of about 10 dB, for which reason the attenuation of the signal which is received is correspondingly low. The attachment of the terminating resistor on the substrate is in the form of resistance film, technically simplifies the manufacture of the terminating resistor.

In accordance with still another feature of the invention, the second stripline conductor is conductively connected to the antenna and to the receiving diode.

In accordance with still a further feature of the invention, the oscillator is in the form of an IMPATT diode, a BARITT diode, a field-effect transistor, or a Gunn element.

In accordance with again another feature of the invention the receiving diode is in the form of a Schottky diode.

In accordance with again an additional feature of the invention, the oscillator is a Gunn element, the receiving diode is a Schottky diode, the resonator is coupled to the Gunn element and to the Schottky diode at given points, and the optimum line lengths between said coupling points are substantially between $\lambda/4$ and $\lambda/2$, where $\lambda$ is the line wavelength of the center of gravity frequency of a corresponding frequency band generated in the Doppler radar.

In accordance with still a further feature of the invention, there is provided a housing formed of electrically conductive material, the electrical terminals being in the form of electrically insulated feedthroughs passing through the housing.

In accordance with again another feature of the invention, there is provided a tuning screw disposed above the resonator for frequency tuning the resonator. The electrically conductive housing shields the interior of the housing electrically and mechanically. The tuning screw permits the frequency predetermined by the geometry of the dielectric resonator to be varied within a certain bandwidth, which is of great importance if such apparatus is used in different countries with different permissible frequency ranges.

In accordance with again a further feature of the invention, the resonator has geometric dimensions being adjusted for frequency tuning the resonator. The material removal can be accomplished, for instance, by mechanically grinding, by removal by means or a laser beam, or by similar methods.

In accordance with again an additional feature of the invention, the resonator includes layers having different dielectric constants or thicknesses applied thereto frequency tuning the resonator. This is done for the frequency tuning of the dielectric resonator.

In accordance with still an additional feature of the invention, the layers are formed of a material from the group consisting of resins and varnishes.

In accordance with still a further feature of the invention, the layers are enriched with dielectric fillers. The resins or varnishes which can be considered for this purpose are epoxy resins, polyesters and acrylic resins, having a dielectric constant which is as high as possible and approximately 40.

The filler can be titanium dioxide, for instance.

In accordance with again a further feature of the invention, the resonator is cylindrical.

In accordance with a concomittant feature of the invention, at least one of the fillers and resonator are formed of a material from the group consisting of Al$_2$O$_3$, barium tetratitanate, and a zirconium-titanium-tin oxide with the formula:

$$(Zr_xTi_ySn_z)O_4, \text{ wherein } x+y+z=2.$$

In this connection, various zirconium-titanium-tin oxides, especially $(Zr_{0.5}TiSn_{0.5})O_4$, have been found to be particularly suitable, since heavy frequency changes of such a resonator do not occur as a function of the temperature in the range of the applied temperature, or since the frequency changes due to the temperature compensate the temperature dependence of the high-frequency oscillator.

Other features which are considered as characteristic for the invention are set forth in the appended claims.

Although the invention is illustrated and described herein as embodied in a stripline Doppler radar, it is nevertheless not intended to be limited to the details shown, since various modifications and structural changes may be made therein without departing from the spirit of the invention and within the scope and range of equivalents of the claims.

Figure 2:
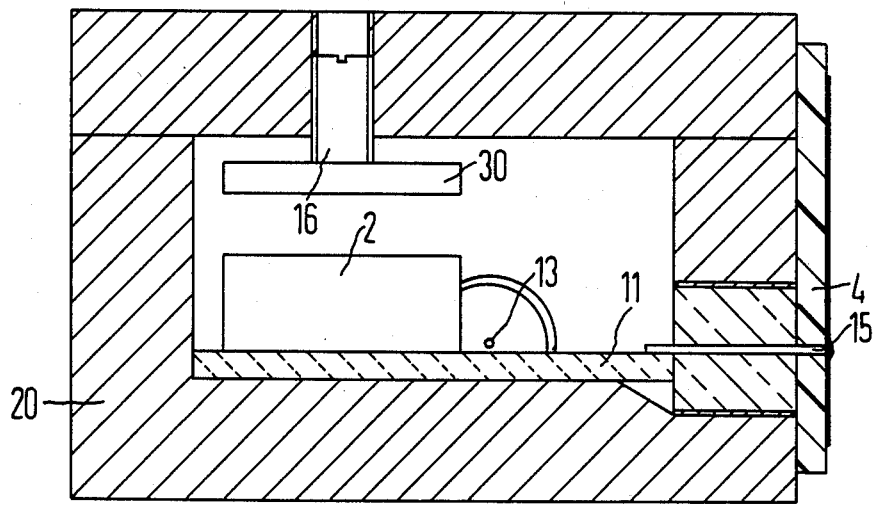

The construction and method of operation of the invention, however, together with additional objects and advantages thereof will be best understood from the following description of specific embodiments when read in connection with the accompanying drawings, in which:

FIG. 1 is a diagrammatic, cross-sectional view of a stripline Doppler radar according to the invention, as seen in a direction parallel to the axes of symmetry of the external electrical terminals; and FIG. 2 is another sectional view of the stripline Doppler radar, taken along the dot-dash line II—II in FIG. 1 in the direction of arrows, which is perpendicular to the plane of the drawing of FIG. 1.

Referring now to the figures of the drawing in detail and first particularly to FIG. 1 thereof, there is seen a view of the essential structure of a stripline Doppler radar 1 according to the invention. The Doppler radar includes an insulating substrate 11 which may be formed of Al$_2$O$_3$ ceramic, quartz, teflon, or fiberglass-reinforced teflon, for example. A stripline circuit formed of a first strip line conductor 5 and a second stripline conductor 6 is mounted on the insulating substrate 11. A dielectric resonator 2 which may be cylindrical is attached to the substrate 11 between the stripline conductors 5 and 6. The resonator 2 may be formed of barium-tetratitanate, Al$_2$O$_3$ ceramic or a zirconium-titanium-tin oxide with the formula: $(Zr_xTi_ySn_z)O_4$ where $x+y+z=2$. The resonator 2 is attached in such a manner that a part of the area of the resonator may cover part of the surface of the stripline conductor 5 and/or part of the surface of the stripline conductor 6, the resonator 2 may be tangential to the stripline conductor 5 and 6, or the resonator 2 may not cover any part of the surfaces of the stripline conductors 5 and 6 or be tangential thereto.

A high-frequency oscillator which may be a Gunn element, an IMPATT diode, a BARITT diode or a field-effect transistor, is attached to one end of the stripline conductor 5. The other end of the stripline conductor 5 is provided with a terminating resistor 8 which can be applied as a resistive film on the substrate 11 and may be formed of titanium, graphite or palladium. At least one receiving diode 7, such as a Schottky diode, is disposed on one end of the stripline conductor 6. The other end of the stripline conductor 6 is connected to an antenna 4 through an electrical terminal 15. If a Schottky diode is used as the receiving diode 7 and a Gunn element is used as the high-frequency oscillator 3, the dielectric resonator 2 is adjusted in such a way that the optimum line lengths between the coupling points of the dielectric resonator on one hand and the Gunn element or Schottky diode on the other hand, are approximately from $\lambda/4$ to $\lambda/2$ m where $\lambda$ is the line wavelength of the center-of-gravity frequency of the corresponding frequency band generated in the Doppler radar.

The other terminal of the high-frequency oscillator 3 which is not connected to the stripline conductor 5, is connected to a housing 20 by way of a through contact 17 and is thus grounded, as indicated in the drawing by the appropriate symbol. Similarly, the second terminal of the receiving diode 7, which is not connected to the stripline conductor 6, is likewise grounded by means of a through contact 18.

Instead of using the one receiving diode 7 which is shown, several receiving diodes could be used as an alternative.

Shifting the resonator 2 relative to the stripline conductors 5 and 6, controls the radiated frequency and the power delivered directly from the oscillator to the receiving diode, the so-called pumping power, and therefore it also controls the sensitivity of the receiving diode with respect to the receiving power.

The power is transmitted from the stripline conductor 5 on the oscillator side to the stripline conductor 6 on the receiving side with a coupling loss of about 10 dB. Because of this, the attenuation of Doppler signals which are very close to the carrier frequency, is accordingly small on the receiving side and the Schottky diode therefore has practically optimum sensitivity, especially since the Schottky diode is coupled to the transmitting branch for optimum sensitivity. D-c voltages and Doppler voltages are fed to and are taken from the high-frequency oscillator 3 and the receiving diode 7, respectively, through the bandpass or lowpass filters 9, 10. The use of the resonator 2 as a coupler between the film terminating resistor 8 and a suitably constructed antenna which does not produce a metallic connection between the stripline conductor and the housing, eliminates the need for coupling capacitors, because the d-c voltage is automatically blocked off everywhere. The lowpass or band rejection filters 9 and 10 can be constructed, for instance, by providing metallized surfaces 22, 23, 24, 25 on the substrate 11, which are capacities or low-resistance λ/4 lines, and by providing thin strip metallizations 26, 27, 28 and 29 likewise disposed on the substrate 11, which are inductances or high-impedance λ/4 lines. The metallizations for the stripline conductors and the lowpass filters on the substrate 11 can be formed of titanium, platinum, gold or chromium, copper, gold, for instance. A glass cast-over external electrical terminal 13 in the form of a coaxial member leads through from the lowpass filter 9 through the surrounding housing 20 to the surroundings; similarly, an external electrical lead 14 is attached to the lowpass filter 10. A similarly constructed electrical terminal is disposed between the stripline conductor 6 and the antenna 4. The entire stripline Doppler radar is surrounded by a housing of conductive material.

The substrate 11 is inserted into the housing 20 in such a manner that it adjoins and is flush to the housing wall, to which the electrical lead 15 that leads to the antenna 4 is attached. The substrate 11 may be spaced a certain distance from the housing 20 on the other three sides. When using a transmitting frequency of 9.35 GHz and an $Al_2O_3$ substrate, an approximately square substrate with a side length of about 13 mm and a thickness of 0.6 mm can be used. The housing may be in the shape of a slab with the following dimensions: length about 20 mm, width about 18 mm and height about 14 mm, at the outer surface of the housing, at which the electric terminal 15 is fastened. The antenna 4, which is suitable for high-frequency usage, is attached to a large surface, may be constructed in the form of a stripline antenna and may be formed of fiberglass-reinforced teflon which is metallized teflon on both sides, or it may be a post protruding into a waveguide.

FIG. 2 is a sectional view of the stripline Doppler radar according to the invention, taken along the dot-dash line II—II in FIG. 1 and perpendicular to the plane of the drawing. Features of FIG. 2 which are similar to these of FIG. 1 are provided with the same reference symbols and will not be described again. A tuning screw 16 is disposed above the dielectric resonator 2 for adjusting a circular metallic plate 30 at a definite distance from the dielectric resonator 2. The frequency of the dielectric resonator can be varied between 9.2 GHz and 10.2 GHz by turning the tuning screw 16 with the plate 30. As an alternative, the frequency can be tuned by making geometric changes in the dimensions or by dielectrically coating of the resonator 2.

The Doppler signal taken off at the terminal 13 is amplified by means of a low-noise amplifier and is subsequently evaluated.

The stripline Doppler radar according to the invention can be used, for instance, as a moving-target indicator, a velocity measuring device, a door opener, or a control for traffic lights.

The foregoing is a description corresponding in substance to German application P No. 33 22 304.1, dated June 21, 1983, the International priority of which is being claimed for the instant application, and which is hereby made part of this application. Any material discrepancies between the foregoing specification and the aforementioned corresponding German application are to be resolved in favor of the latter.

We claim:

1. Stripline Doppler Radar, comprising at least one high-frequency oscillator, a first stripline conductor connected to said oscillator, a second stripline conductor spaced from said first stripline conductor, at least one receiving diode connected to said second stripline conductor, an antenna connected to said second stripline conductor, low frequency external electrical terminals, filters connected between said stripline conductors and said external electrical terminals for inhibiting leakage of high-frequency power through said external electrical terminals, and a dielectric resonator adjustable to an optimal position in a range from a location between said stripline conductors to a location partially covering one of said stripline conductors for conducting power delivered by said oscillator through said stripline conductor and said dielectric resonator to said receiving diode and said antenna, and wherein the ratio between the power received through the antenna and the power transmitted from said oscillator through said resonator directly to said receiving diode is such that optimal sensitivity of the doppler radar is attained.

2. Stripline Doppler radar according to claim 1, wherein said filters are band rejection filters.

3. Stripline Doppler radar according to claim 1, wherein said filters are lowpass filters.

4. Stripline Doppler radar according to claim 1, including an insulating substrate, said stripline conductors, resonator, oscillator, receiving diode and filters being disposed in common on said substrate.

5. Stripline Doppler radar according to claim 1, wherein said oscillator has a high-frequency output and said first stripline conductor has one end connected to said high-frequency output and another end, and including a terminating resistor connected to the other end of said first stripline conductor.

6. Stripline Doppler radar according to claim 5, including a substrate on which said stripline conductors are disposed, said terminating resistor being in the form of a resistance film disposed on said substrate.

7. Stripline Doppler radar according to claim 1, wherein said second stripline conductor is conductively connected to said antenna and to said receiving diode.

8. Stripline Doppler radar according to claim 1, wherein said oscillator is in the form of an IMPATT diode.

9. Stripline Doppler radar according to claim 1, wherein said oscillator is in the form of a BARITT diode.

10. Stripline Doppler radar according to claim 1, wherein said oscillator is in the form of a field-effect transistor.

11. Stripline Doppler radar according to claim 1, wherein said oscillator is in the form of a Gunn element.

12. Stripline Doppler radar according to claim 1, wherein said receiving diode is in the form of a Schottky diode.

13. Stripline Doppler radar according to claim 1, wherein said oscillator is a Gunn element, said receiving diode is a Schottky diode, said resonator is coupled to said Gunn element and to said Schottky diode at given points, and the optimum line lengths between said coupling points are substantially between $\lambda/4$ and $\lambda/2$ where $\lambda$ is the line wavelength of the center of gravity frequency of a corresponding frequency band generated in said Doppler radar.

14. Stripline Doppler radar according to claim 1, including a housing formed of electrically conductive material, said electrical terminals being in the form of electrically insulated feedthroughs passing through said housing.

15. Stripline Doppler radar according to claim 1, including a tuning screw disposed above said resonator for frequency tuning said resonator.

16. Stripline Doppler radar according to claim 1, wherein said resonator has geometric dimensions being adjusted for frequency tuning said resonator by means of material removal.

17. Stripline Doppler radar according to claim 1, wherein said resonator includes layers having different dielectric constants frequency tuning said resonator.

18. Stripline Doppler radar according to claim 17, wherein said layers are formed of a material selected from the group consisting of epoxy resins, polyesters and arcylic resins.

19. Stripline Doppler radar according to claim 18, wherein said layers are enriched with dielectric fillers selected from the group consisting of titanium dioxide, $Al_2O_3$, barium tetratitanate, and zirconium-titanium-tin-oxygen compound having the formula $(Zr_xTi_ySn_z)O_4$, wherein $x+y+z=2$ and wherein x, y and z are positive integers or 0.

20. Stripline Doppler radar according to claim 19, wherein at least one of said fillers and resonator are formed of a material from the group consisting of Al$_2$O$_3$, barium tetratitanite, and a zirconium-titanium-tin-oxygen compound with the formula:

$(Zr_xTi_ySn_z)O_4$, wherein $x+y+z=2$, wherein x, y and z are positive integers or 0.

21. Stripline Doppler radar according to claim 1, wherein said resonator includes layers having different thicknesses frequency tuning said resonator.

22. Stripline Doppler radar according to claim 21, wherein said layers are formed of a material selected from the group consisting of epoxy resins, polyesters and acrylic resins.

23. Stripline Doppler radar according to claim 22, wherein said layers are enriched with dielectric fillers selected from the group consisting of titanium dioxide, Al$_2$O$_3$, barium tetratitanate, and zirconium-titanium-tin-oxygen compound having the formula $(Zr_xTi_ySn_z)O_4$, wherein $x+y+z=2$ and wherein x, y and z are positive integers or 0.

24. Stripline Doppler radar according to claim 23, wherein at least one of said fillers and resonator are formed of a material form the group consisting of Al$_2$O$_3$, barium tetratinatite, and a zirconium-titanium-tin-oxygen compound with the formula:

$(Zr_xTi_ySn_z)O_4$, wherein $x+y+z=2$, wherein x, y and z are positive integers or 0.

25. Stripline Doppler radar according to claim 1, wherein said resonator is cylindrical.

26. Stripline Doppler radar according to claim 1, wherein at least one of said resonator is formed of a material from the group consisting of Al$_2$O$_3$, barium tetratinatite, and a zirconium-titanium-tin-oxygen compound with the formula:

$(Zr_xTi_ySn_z)O_4$, wherein $x+y+z=2$, wherein x, y and z are positive integers or 0.

* * * * *